(12) United States Patent
Hanrahan et al.

(10) Patent No.: US 6,311,200 B1
(45) Date of Patent: Oct. 30, 2001

(54) RECONFIGURABLE PROGRAM SUM OF PRODUCTS GENERATOR

(75) Inventors: Shaila Hanrahan; Christopher E. Phillips, both of San Jose, CA (US)

(73) Assignee: Chameleon Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/401,313

(22) Filed: Sep. 23, 1999

(51) Int. Cl.[7] .................................................. H03K 19/00
(52) U.S. Cl. ............................................. 708/232; 326/39
(58) Field of Search ................................ 708/232; 326/39

(56) References Cited

U.S. PATENT DOCUMENTS 4,617,479 * 10/1986 Hartmann et al. ................... 708/232
4,831,285 * 5/1989 Gaiser .................................... 326/39
4,876,466 * 10/1989 Kondou et al. ...................... 708/232
4,972,105 * 11/1990 Burton et al. .......................... 326/39

* cited by examiner

*Primary Examiner*—David H. Malzahn
(74) *Attorney, Agent, or Firm*—Burns Doane Swecker & Mathis LLP (57) ABSTRACT

A reconfigurable programmable sum of products generator allows for multiple configurations to be associated with a programmable sum of products generator. These configurations can be modified by changing the configurations in an associated configuration memory for the programmable sum of products generator. By using a reconfigurable programmable sum of products generator structure, a dense and highly interconnected logic is produced. Such a dense and highly interconnected logic is particularly valuable for use in the control path of a reconfigurable system.

17 Claims, 10 Drawing Sheets

RECONFIGURABLE PROGRAM SUM OF PRODUCTS GENERATOR

BACKGROUND OF THE INVENTION

The present invention relates to reconfigurable logic chips.

Reconfigurable logic chips, such as field programmable gate arrays (FPGAs) have become increasingly popular. Such chips allow logic to implement different circuits at different times.

FPGAs are being increasingly used because they offer greater flexibility and shorter development cycles than traditional Application Specific Integrated Circuits (ASICs) while providing most of the performance advantages of a dedicated hardware solution.

One growingly popular use of FPGAs is referred to as reconfigurable computing. In reconfigurable computing, hardware logic functions are loaded into the FPGA as needed to implement different sections of a computationally intensive code. By using the FPGAs to do the computational intensive code, advantages are obtained over dedicated processors. Reconfigurable computing is being pursued by university researchers as well as FPGA companies.

Many FPGAs implement logic using lookup tables with feedback. These systems tend to be slow and inefficient especially for reconfigurable computing uses. It is desired to have an improved reconfigurable chip for reconfigurable computing.

SUMMARY OF THE PRESENT INVENTION

The present invention comprises a reconfigurable programmable sum of products (PSOP) generator. The reconfigurable programmable sum of products generator of the present invention is reconfigurable for a number of different functions using a configuration memory.

In a preferred embodiment, multiple configuration planes are stored local to the reconfigurable programmable sum of products generator. This allows the reconfigurable programmable sum of products generator to switch between the different configuration planes without waiting for the loading of a configuration from off-chip. In one embodiment, the configuration memory for the reconfigurable sum of products generator uses master/slave latches. Preferably, a backup configuration plane can be loaded from off-chip, while a foreground configuration plane is connected to the reconfigurable PSOP generator. This speeds the operation of the reconfigurable chip.

The memory units for the reconfigurable PSOP generator are preferably interspersed with the other elements of the reconfigurable PSOP generator. The memory units can be loaded using configuration lines. In a preferred embodiment, a relatively large number of configuration bits are loaded during each cycle to increase the configuration loading speed.

Conventional prior art PLAs are typically one-time programmable by designing a metalization layer to connect or not connect transistors in the PLA. Other prior art devices include Programable Array Logic© (PAL©), which connects AND and OR planes using fusible links, UV-erasable EPROM link or E²ROM links. Such PALs tend to take a significant amount of time to program and thus are typically used for static designs and are inappropriate for use in a reconfigurable computing environment. Additionally, such connections do not allow for using multiple configuration planes.

In a preferred embodiment of the present invention, the reconfigurable programmable sum of products generator is arranged as a reconfigurable dynamic PSOP generator. Dynamic programmable sum of products generators use precharged product term lines and output lines. In a preferred embodiment of the present invention, the programmable sum of products generator is arranged so that the precharging of the product term and output lines is done during a first portion of the cycle, and the evaluation of the product plane and summation plane is done in the second portion of the cycle. This produces speed advantages for the entire circuit because the first part of the cycle can be used by other circuitry to produce the inputs to the reconfigurable programmable sum of products generator. Power consumption is also reduced. Conventional dynamic programmable sum of products generators precharge a first plane and evaluate a second plane during one half-cycle, and precharge the second plane and evaluate the first plane during the other half-cycle.

The reconfigurable programmable sum of products generator structure of the present invention is dense and highly interconnected and thus is advantageous for the control fabric of a reconfigurable chip. In one embodiment, the reconfigurable programmable sum of products generator is arranged as a state machine so as to produce addresses to a configuration state memory. The configuration state memory uses these addresses to provide configuration bits for a data path unit. The configuration state memory unit can be arranged so that a relatively few address bits can output a relatively large number of data path unit configuration bits.

DETAILED DESCRIPTION OF THE PREFERRED EMBODIMENT

Figure 1:
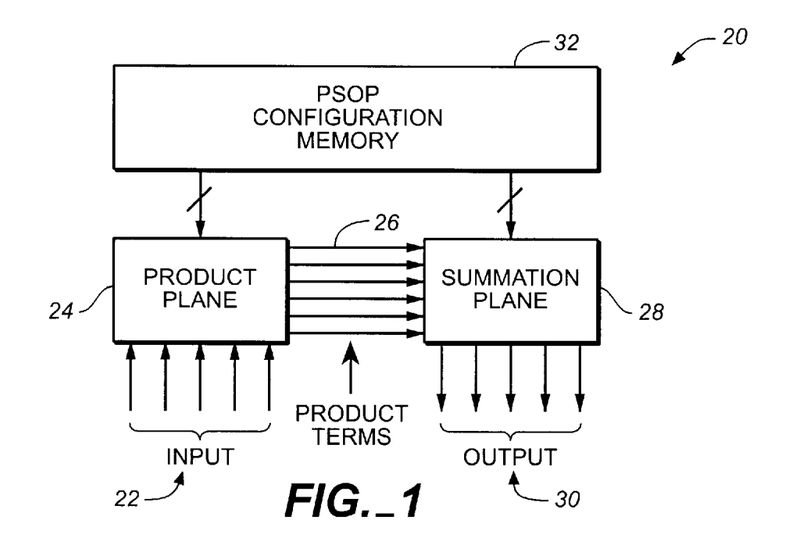
FIG. 1 is a diagram of a reconfigurable programmable sum of products generator of one embodiment of the present invention.

FIG. 1 illustrates a reconfigurable programmable sum of products generator 20 for use with the present invention. The programmable sum of products generator includes input lines 22, Product plane 24, product term lines 26, Summation plane 28, and output lines 30. A PSOP configuration memory 32 provides the configurations for the product and summation planes.

For CMOS processes, the product plane 24 and the summation plane 28 are implemented as NOR planes with the inputs and outputs inverted. This NOR-NOR inverter configuration speeds up the operation of the planes since plane element transistors are arranged in parallel rather than in series.

Figure 2:
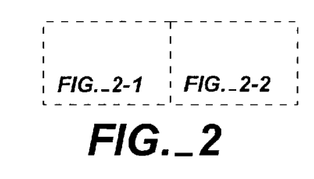
FIG. 2 is a diagram of one embodiment of a dynamic reconfigurable programmable sum of products generator of the present invention.

FIG. 2 illustrates one embodiment of the reconfigurable programmable sum of products generator of the present invention. The reconfigurable programmable sum of products generator 40 has a Product plane 42 and Summation plane 44. Arrays of plane elements define the first and second planes. The reconfigurable product plane element 46 is connected to input line 50 and product term line 52. If the reconfigurable product plane element is activated by the configuration memory, the reconfigurable product plane element 46 uses the data on the input line 50 to determine whether to affect the product term line 52. The reconfigurable Summation plane element 48 is connected to product term line 52 and to output line 54.

The programmable sum of products generator of FIG. 2 is dynamic. Product term line 52 is precharged by precharge circuitry 56. Precharge circuitry 58 is used to precharged the output lines. The use of the precharge circuitry allows the reconfigurable PSOP generator to operate dynamically and thus save power. During the first part of the clock cycle, the product term lines, including product term line 52 and the output lines, including output line 54 are precharged by the precharge circuitry 56 and 58, respectively. During a second half of the clock cycle, the first plane 42 and second plane 44 evaluate. The AND 64 ensures that data is only sent to the input lines during the second half of the cycle. Logic 53 separates the Product and Summation planes and can be a pass transistor clocked by a late clock.

In a preferred embodiment, the first and second planes 42 and 44 are arranged as NOR planes. The inputs and outputs are inverted using inverters 60 for the input and inverters 62 for the output.

Figure 3:
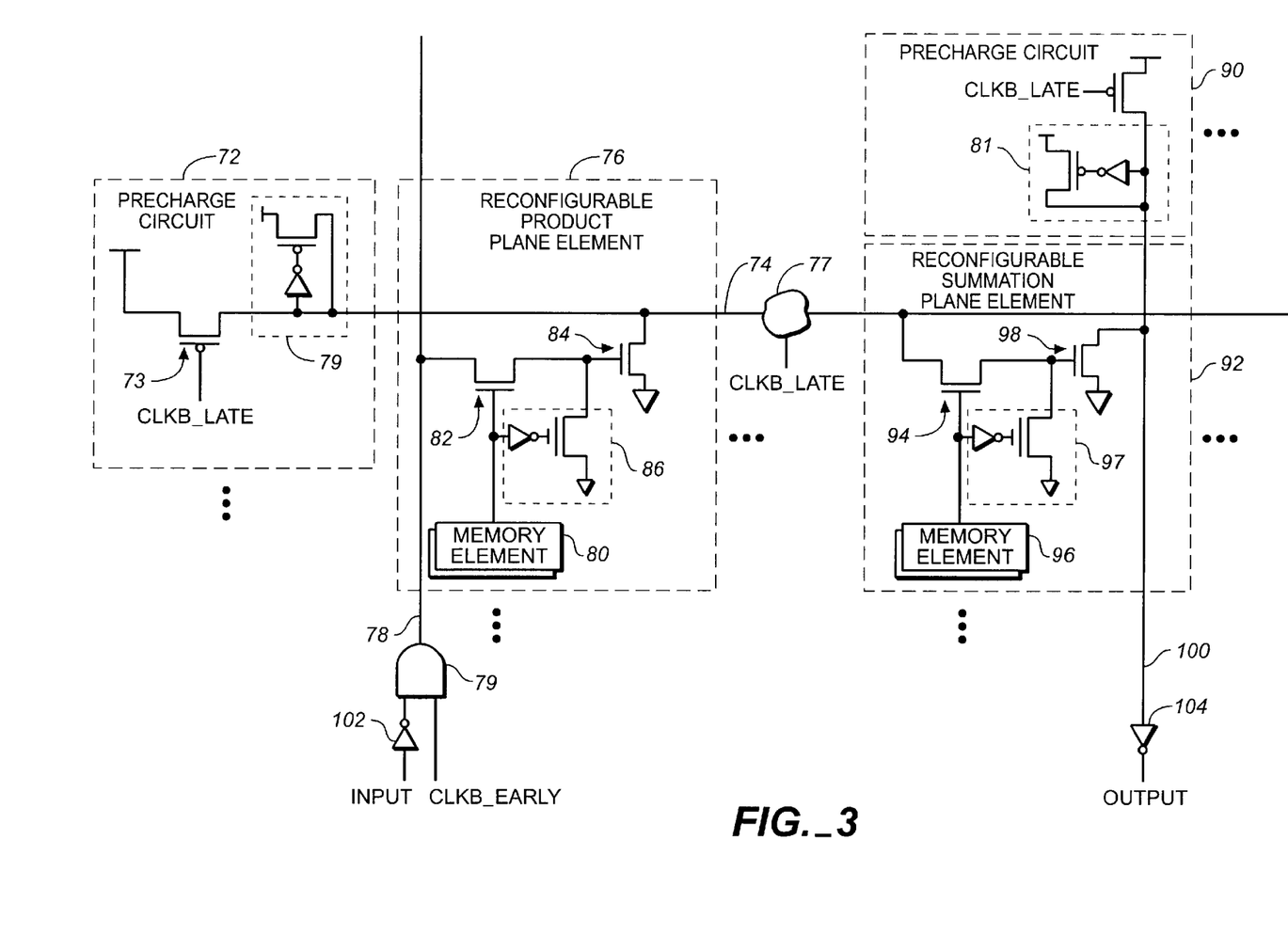
FIG. 3 is a partial diagram of the dynamic reconfigurable programmable sum of products generator of FIG. 2.

FIG. 3 illustrates details of a reconfigurable programmable sum of products generator of one embodiment of the present invention. The reconfigurable programmable sum of products generator 70 includes a precharge circuit element 72 connected to the product term line 74. The Product plane element 76 is connected to the input line 78 as well as the product term line 74. The Product plane element 76 includes a configuration memory element 80 which stores an indication of whether the plane element is active. If the memory element 80 produces a "high" output, the first transistor 82 will be turned on. This connects the input line 78 to the gate of the second transistor 84. If the input line 78 is high and the first transistor 82 is on, the second transistor 84 will turn on, pulling the product term line 74 to ground. A number of Product plane elements are connected to the same product term line 74. Each of the second transistors in the plane elements connected to product line 74 are connected in parallel. If at least one input to an active Product plane element in the row is high, the output on line 74 will be "zero". In effect, a row of Product plane elements implements the "NOR" function on line 74.

The Product plane element 76 also includes a protection circuit 86. The protection circuit 86 protects the reconfigurable circuit from shorting. When transistor 73 in the precharge circuit 72 is on during the precharge half-cycle, the product term line 74 is connected to the supply power. If the gate of the transistor 84 is high, there will be a direct path between power and ground, which can damage or destroy the reconfigurable chip.

During normal operation, when the output of the memory element 80 is "high", the gate for the second transistor 84 is grounded through transistor 82 since the input line 78 is driven low by AND 79. When the output of the memory element 80 is "low", the transistor 82 is off, thus isolating the line 78 from the second transistor 84. This prevents the gate of the second transistor 84 from going high, avoiding an erroneous operation.

However, when the memory element 80 transitions from a "high" value to a "low" value, the gate to the second transistor 84 could be "high" when the output of memory element 80 goes "low". The first transistor 82 is turned off by the memory element 80 and thus can keep the gate of the second transistor 84 high. During the next precharge half-cycle, transistors 73 and 84 will both be on, causing a short. The protection element 86 grounds the gate of the second transistor 84 when the output of memory element 80 goes low, preventing a short on the transition of the state of the memory element 80.

The second plane includes precharge circuitry 90 and Summation plane element 92. Similar to the Product plane element 76, the Summation plane element 92 includes a first transistor 94 attached to a memory element 96. The memory element 96 determines whether the Summation plane element 92 is active or inactive. When the Summation plane element 92 is active, the first transistor 94 connects the product term line 74 to the gate of the second transistor 98. The Summation plane element will pull the output line 100 to ground depending on whether the Summation plane element is active and the value on the product term line 74. The Summation plane element 92 also includes a protection circuit 97. As described previously, the reconfigurable programmable sum of products generators are implemented as two NOR planes in which the inputs are inverted by inverters 102 and the output is inverted by the inverters 104. A precharge circuit also includes keepers or half-keepers to hold the voltage level of the bus line. FIG. 3 shows two half-keepers 79 and 81.

Figure 4A:
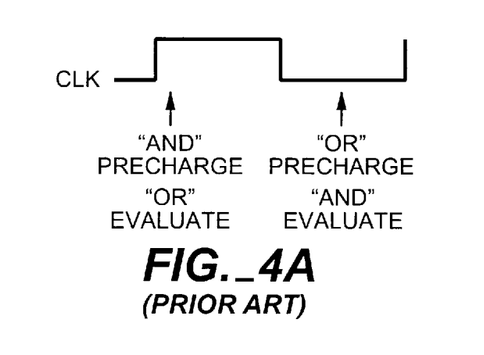
FIG. 4A is a diagram that illustrates the clocking scheme of a prior art dynamic PLA.

FIG. 4A is a diagram that illustrates the operation of a prior art dynamic PLA. In addition to prior art dynamic PLAs being nonreconfigurable, prior art dynamic PLAs have been arranged such that one of the planes, such as the Product plane is precharged during one-half cycle, while the other plane, the Summation plane, is evaluated. During the second-half cycle, the Summation plane is precharged, while the Product plane evaluates.

Figure 4B:
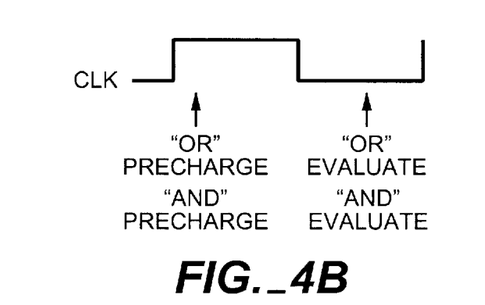
FIG. 4B is a diagram that illustrates the precharge/evaluate scheme of the programmable sum of products generator of one embodiment of the present invention.

The operation of the present invention is shown in FIG. 4B. In the present invention, both the planes are precharged during the first half-cycle. During the second half-cycle, both the Summation and the Product planes are evaluated. This arrangement has the advantage that during the first half cycle, the inputs to the programmable sum of products generator can be calculated by other circuitry and need not be fixed. During the second half-cycle, both the Summation and Product plane evaluate.

Another advantage of the arrangement in the present invention, can be shown with respect to FIG. 3. During the evaluation of the Summation and Product planes, only one of the transistors 84 or 98 can be active during the same cycle. Assuming that both the Product plane element 76 and the Summation plane element 92 are active, if the transistor 84 grounds line 74, then the transistor 98 will not switch only. If transistor 84 does not switch can line 74 be high and transistor 98 switch on. For this reason, only one of the transistors 84 or 98 could switch in a single cycle. This conserves power consumption. In the prior art clocking scheme, it is possible that two such transistors could both switch during a single cycle.

Figure 5:
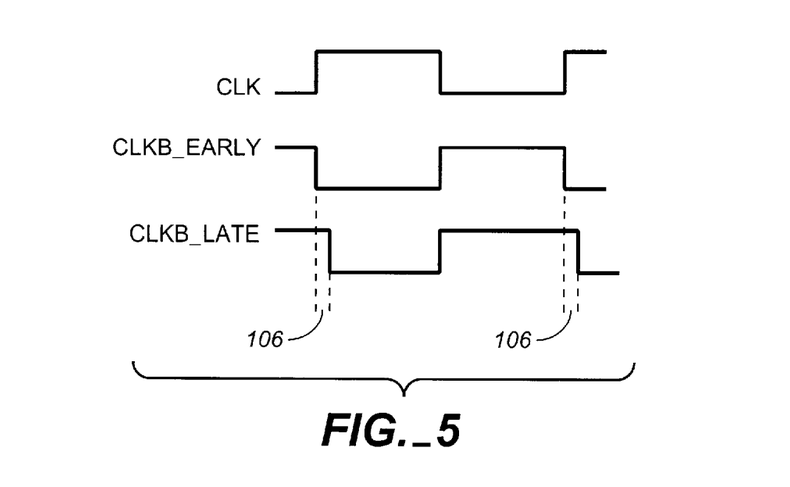
FIG. 5 is a diagram that illustrates clocking scheme used with the diagrams of FIGS. 2 and 3.

FIG. 5 illustrates part of the clocking scheme for the reconfigurable chip of FIG. 3. The signals "CLKB-EARLY" and "CLKB-LATE" are produced from the clock. "CLKB-EARLY" is sent to the AND element 79 coinected to input line 78. "CLKB-LATE" is sent to the precharge circuit 72 and 90 and the logic 77 between the product and summation planes. The early and late clocks are produced so as to allow any charge at the gate of the transistor 84 to be grounded before the precharge period. The switching of "CLKB-EARLY" causes input line 78 and then the gate of transition 84 to go low; after period 106, "CLKB-LATE" goes low causing line 74 to be precharged. Disabling the inputs before precharging, helps give power.

Figure 6A:
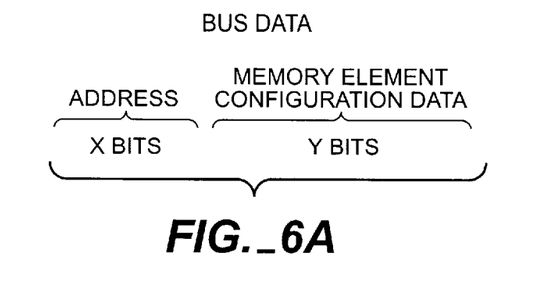
FIGS. 6A and 6B are diagrams that illustrate the arrangement of bus data into address and configuration data.
Figure 6B:
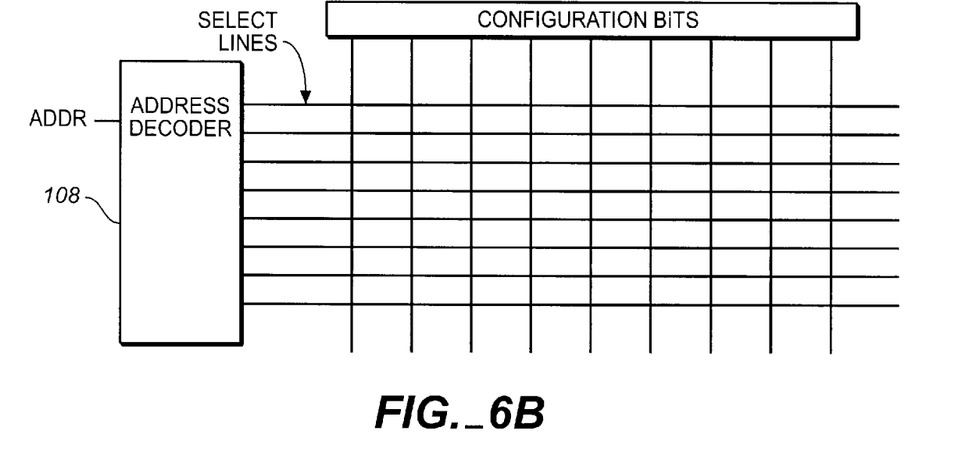
Figure 6C:
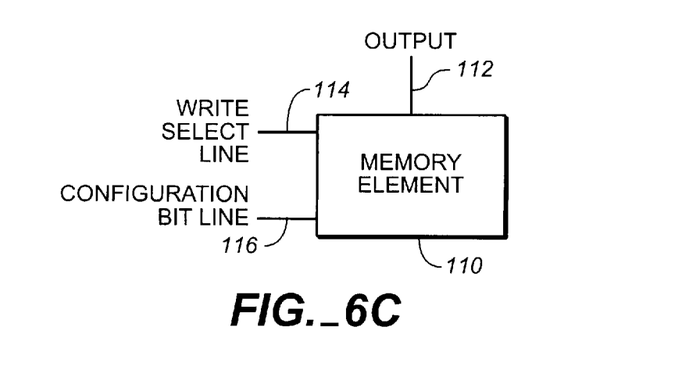
FIG. 6C illustrates a memory element such as that used in FIG. 3, showing the connections to the write select line and a configuration bit line.

FIG. 6A–6C illustrate the loading of configuration bits for the programmable sum of products generator from off-chip to memory elements, such 10 as memory elements 80 and 96 shown in FIG. 3. FIG. 6A illustrates data on the bus. In a preferred embodiment, the bus is 128 bits wide and there are x address bits and y configuration bits such that x+y=128. The bus data, in one embodiment, includes fifteen address bits and one hundred and thirteen configuration data bits.

In FIG. 6B, the select line decoder 108 decodes the address to produce write select lines. A memory element (not shown) is located at the intersection of each of the select lines and configuration bit lines.

FIG. 6C shows a memory element 110. The memory element 110 produces an output on line 112 and has a write select line connection 114 and a configuration bit line connection 116.

Figure 7:
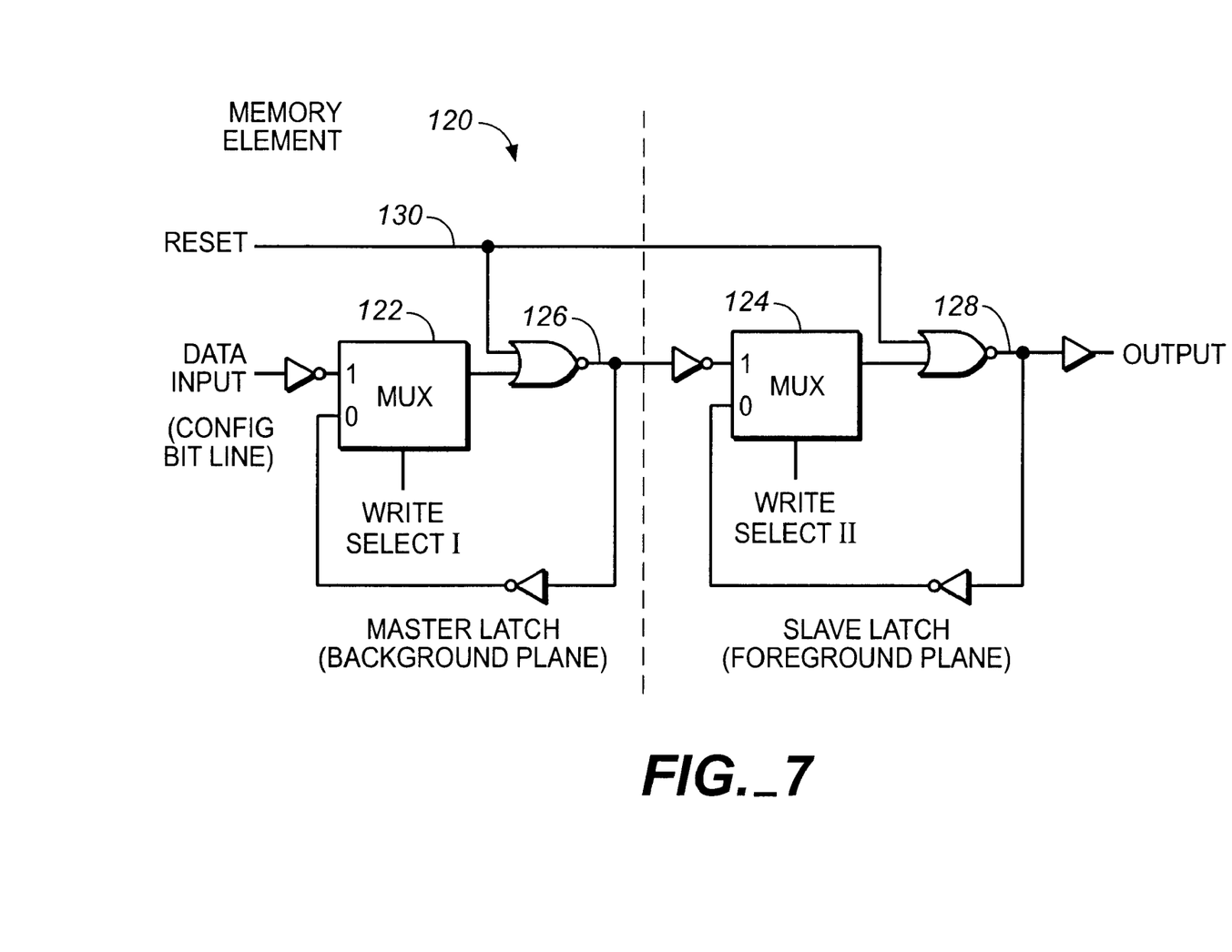
FIG. 7 is a diagram of one embodiment of a memory element for the use with the present invention.

FIG. 7 shows an example of a memory element which can be used with the present invention. This memory element is divided into a master latch which stores the background plane data and a slave latch which stores the foreground plane data. During normal operation of the master/slave latch, the write select line I and write select line II are both low. This causes the multiplexers 122 and 124 to maintain the stored data at nodes 126 and 128. When the write select line I goes high, input data is loaded into the node 126 hence changing the value of the background plane. This input data can be data from the configuration bit line.

When the write select line II goes high, the data at node 126 gets loaded into node 128. This corresponds to the loading of the background plane into the foreground.

Note that the data in the background plane can be loaded while the foreground plane outputs the stored data from node 128. What occurs in this situation is that the write select I goes high allowing the data input over the data input line to be stored at node 126. The write select II is kept low, and thus the stored active plane value at node 128 does not change. Once a new background plane is loaded, the write select I goes low, keeping the new stored background plane bit value at node 126.

The reset line 130 allows for the quick zeroing of nodes 126 and 128. This means that during the initialization of the system, zero values need not be loaded into all the memory elements, using the configuration bits lines and the write select lines.

FIGS. 8–11 illustrate one embodiment of reconfigurable chip that uses a reconfigurable programmable sum of products generator of the present invention. It is to be understood that the reconfigurable programmable sum of products generator could be used for a number of different reconfigurable chip designs and is not to be limited to the examples of FIGS. 8–11.

Figure 8:
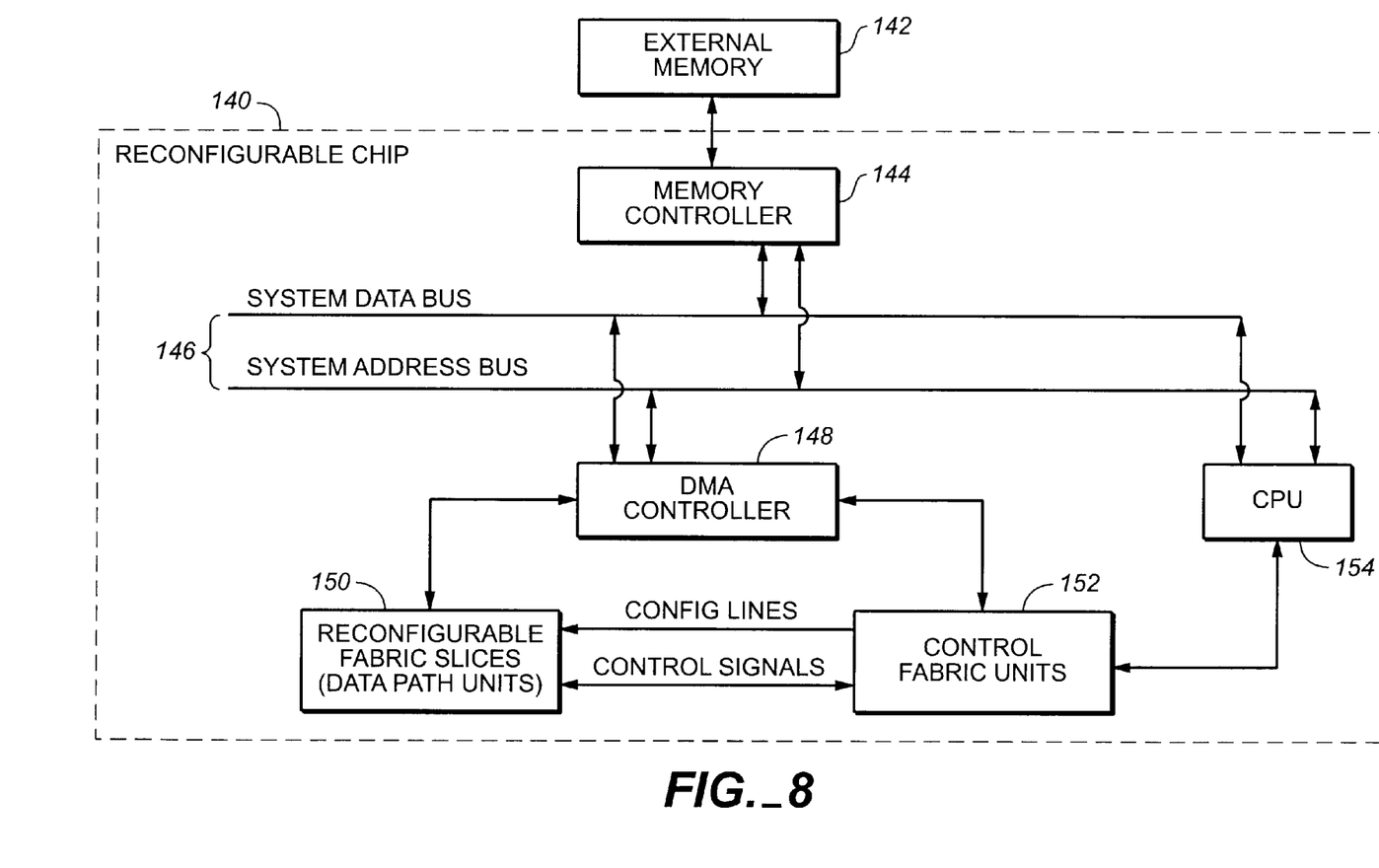
FIG. 8 is a overview diagram illustrating an example of a reconfigurable chip for use with the reconfigurable programmable sum of products generator of the present invention.

FIG. 8 illustrates a reconfigurable chip 140 which can use the reconfigurable programmable sum of products generator of the present invention. The reconfigurable chip 140 is connected to an external memory 142. The memory controller 144 allows data from the external memory 142 to be loaded onto the bus 146. The DMA controller 148 loads data into the reconfigurable fabric slices 150 as well as into the control fabric units 152. The control fabric units 152 contain the reprogrammable programmable sum of products generator units of the present invention (not shown). The reconfigurable chip 140 also includes a CPU 154.

One embodiment of a reconfigurable chip for use with the present invention is disclosed in the patent application "An Integrated Processor And Programmable Data Path Chip For Reconfigurable Computing", Ser. No. 08/884,380, filed Jun. 27, 1998 (now issued as U.S. Pat. No. 5,970,254), incorporated herein by reference.

Figure 9:
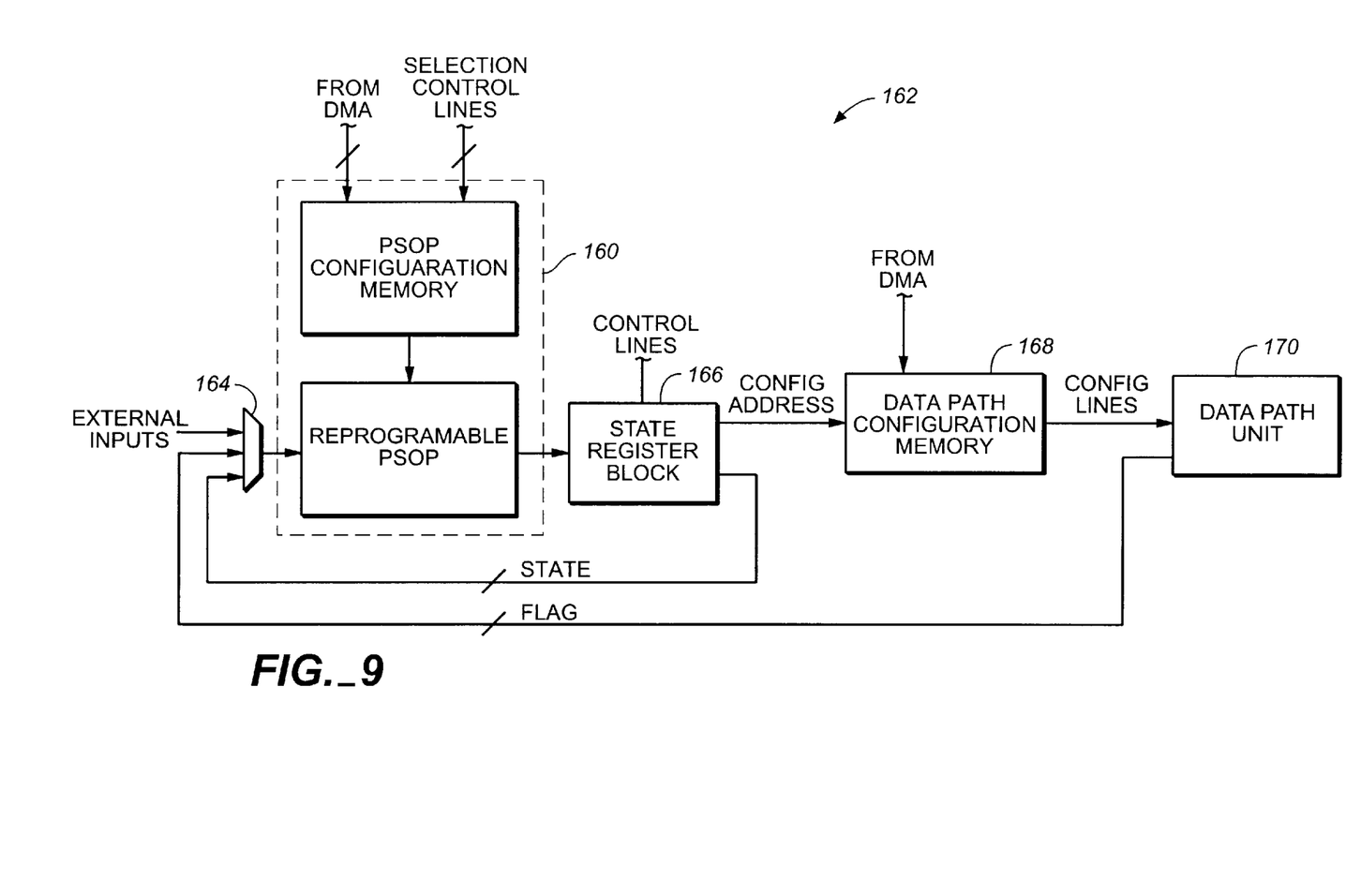
FIG. 9 is a diagram of a reconfigurable programmable sum of products generator used in a control path unit for use with the present invention.

FIG. 9 illustrates the use of the reconfigurable programmable sum of products generator 160 within the control path unit 162. The inputs to the reconfigurable programmable sum of products generator 160 come from multiplexer unit 164. The output of programmable sum of products generator goes to state register block 166. Configuration address data derived from the output of the programmable sum of products generator 160 is sent to a data path configuration memory element 168. The data path configuration memory 168 stores a number of configuration arrangements for the data path unit 170. These configurations allow the data path unit 170 to be reconfigured to do a number of different functions during the operation of the chip without loading data path unit configuration from off-chip. The programmable sum of products generator 160 is part of a state machine that produces configuration addresses for a memory associated with the data path units 170. The programmable sum of products generator 160 can be associated with a number of different data path units. Details of the control path unit 162 for one embodiment of the present invention are described in the pending patent application, "Control Fabric For Enabling Data Path Flow," Ser. No. 09/401,194, filed Sep. 23, 1999, which is incorporated herein by reference.

Figure 10:
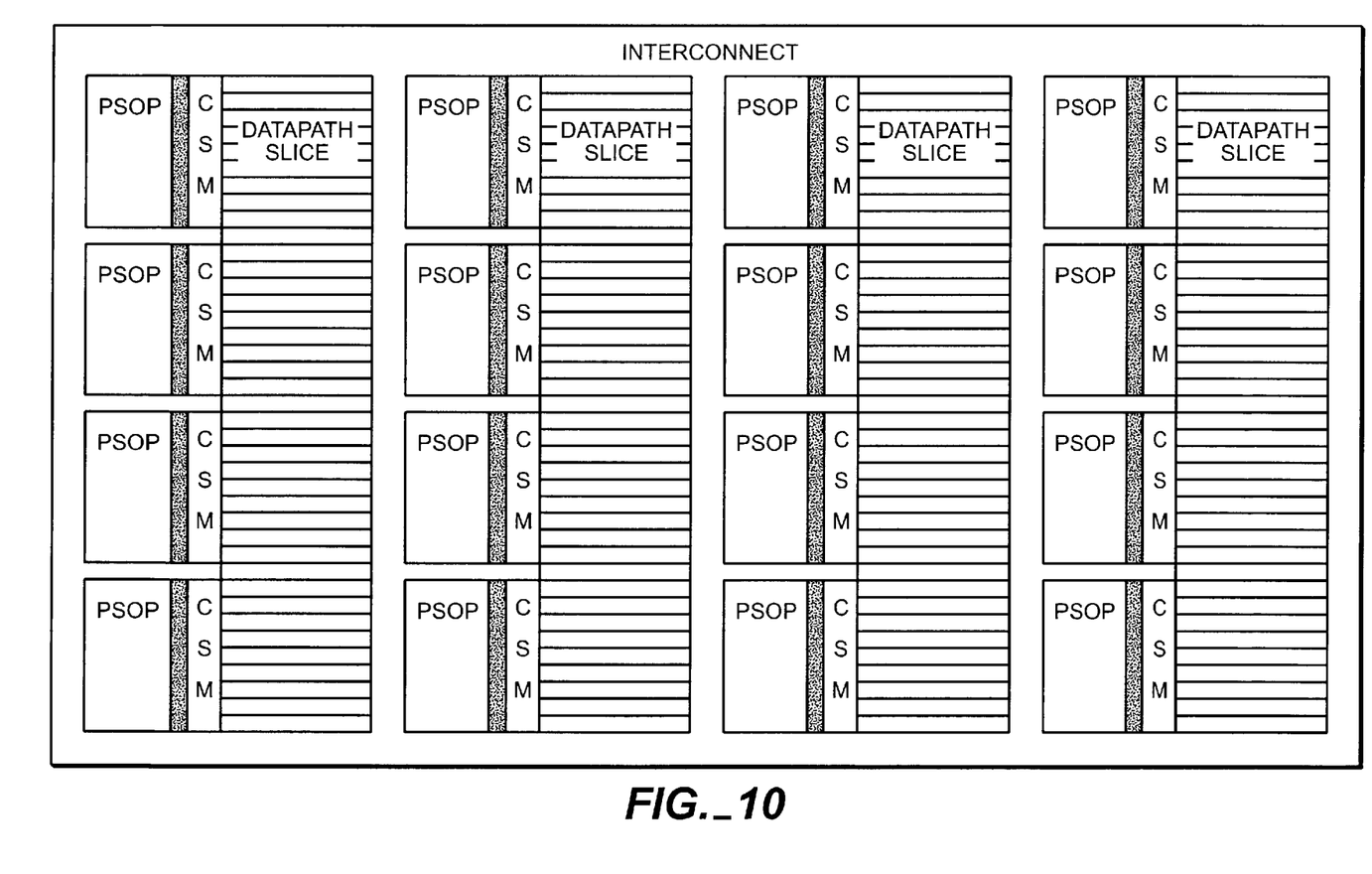
FIG. 10 illustrates the interconnection of the reconfigurable programmable sum of products generators in the reconfigurable chip of one embodiment in the present invention.
Figure 11:
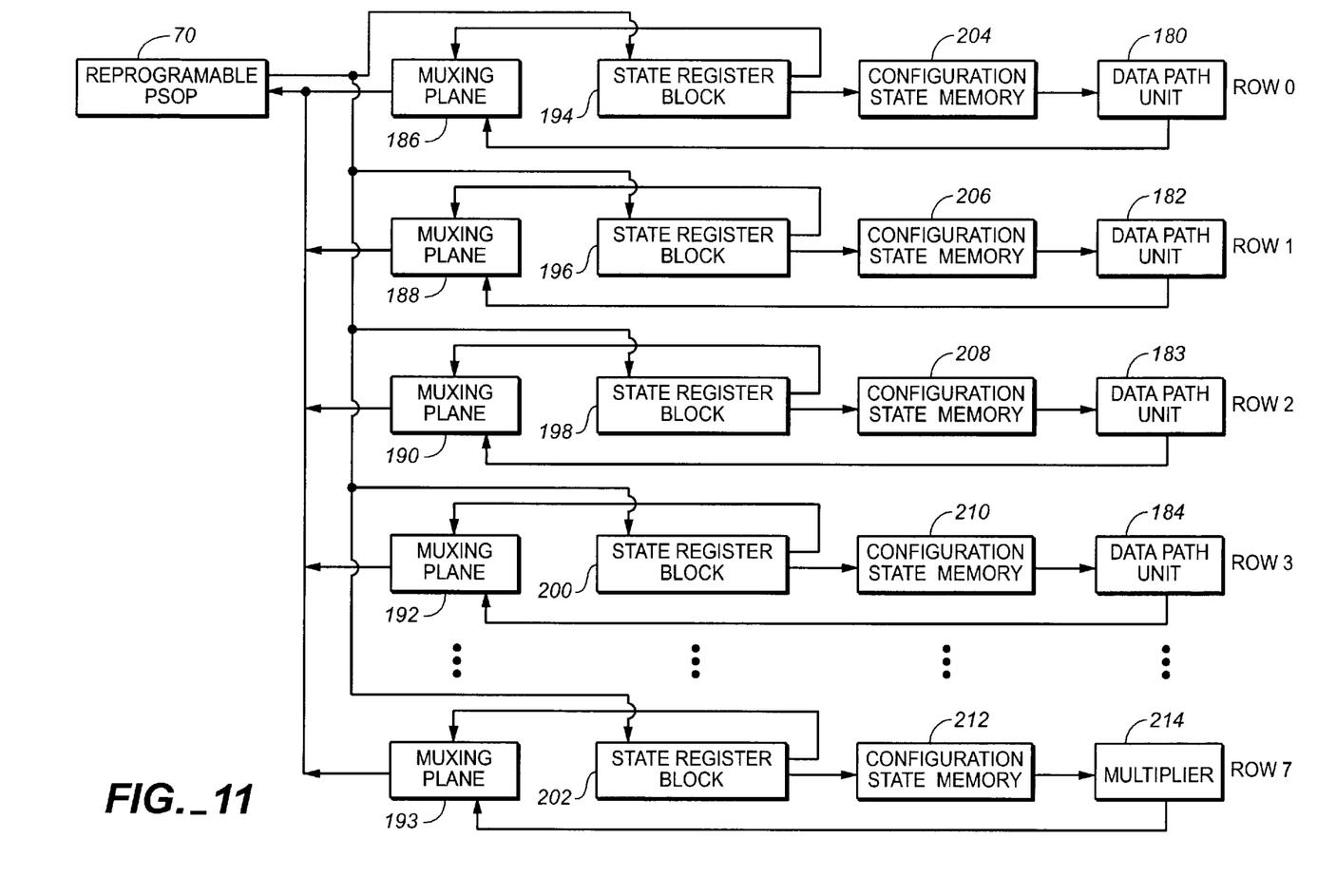
FIG. 11 is a diagram that illustrates the reconfigurable programmable sum of products generator interconnected with multiple data path units of a tile in the reconfigurable chip.

FIG. 10 illustrates the interspersing of the programmable sum of products generator units along with the configuration state memory units and data path slice units. FIG. 11 illustrates one embodiment in which a reconfigurable programmable sum of products generator 170 is connected to a number of data path units 180, 182, 183, and 184. The reconfigurable programmable sum of products generator is arranged with sixteen inputs and thirty-two outputs. The inputs to the programmable sum of products generator are sent from multiplexer planes 186, 188, 190, and 192. The output to the programmable sum of products generator goes to the state register blocks 194, 196, 198, 200, and 202. The configuration state memories 204, 206, 208, 210, and 212 are connected to the state register blocks. A multiplier 214 rather than a data path unit is used for one row of the tile.

It will be appreciated by those of ordinary skill in the art that the invention can be implemented in other specific forms without departing from the spirit or central character thereof. The presently disclosed embodiments are therefore considered in all respects to be illustrative and not restrictive. The scope of the invention is illustrated by the appended claims rather than the foregoing description, and all changes which come within the meaning and range for equivalence thereof are intended to be embraced herein.

We claim:

1. A reconfigurable system comprising:
a reconfigurable programmable sum of products generator which is configured by an associated configuration memory wherein the configuration memory is adapted to concurrently store more than one configuration for the programmable sum of products generator, the more than one configurations including a foreground plane configuration that currently configures the reconfigurable programmable sum of products generator and a background plane configuration which is switchable into the foreground plane configuration.

2. The reconfigurable system of claim 1, wherein the programmable sum of products generator has product term lines and output term lines and a precharge circuit to precharge the product term lines and output term lines during a first portion of a clocking cycle and wherein the input terms and output terms are evaluated during a second portion of the clock cycle.

3. The reconfigurable system of claim 1, wherein the programmable sum of products generator includes two NOR evaluation planes, each plane having precharged circuitry, each plane having an array of evaluation elements.

4. The reconfigurable system of claim 3, wherein the evaluation elements have a input transistor connecting between a first line and the gate of a second transistor, the gate of the first transistor being connected to a memory element of the configuration memory, the second transistor connected between a second line and ground, wherein, in the first NOR plane, the first lines are input lines and the second lines are product term lines, and in the second NOR plane, the first lines are product term lines and the second lines are output lines.

5. The reconfigurable system of claim 1, wherein the configuration memory is such that a configuration for the reconfigurable programmable sum of products generator can be loaded into a background plane of the configuration memory while a foreground plane of the configuration memory maintains a configuration for the programmable sum of products generator.

6. A reconfigurable system comprising:
a reconfigurable programmable sum of products generator which is configured by an associated configuration memory wherein the configuration memory is adapted to concurrently store more than one configuration for the programmable sum of products generator, further comprising a control fabric unit with a state machine unit, wherein the reconfigurable programmable sum of products generator is part of the state machine unit.

7. The reconfigurable system of claim 2, wherein the control fabric unit further comprises a functional block configuration memory which is addressed using the reconfigurable programmable sum of products generator and a functional block which gets its configuration from the functional block configuration memory.

8. A reconfigurable system comprising:
a reconfigurable programmable sum of products generator which is configured by an associated configuration memory wherein the configuration memory is adapted to concurrently store more than one configuration for the programmable sum of products generator, wherein the programmable sum of products generator has a NOR-NOR inverter configuration.

9. A reconfigurable system comprising:
a reconfigurable programmable sum of products generator which is configured by an associated configuration memory wherein the configuration memory is adapted to concurrently store more than one configuration for the programmable sum of products generator, wherein the configuration memory include master/slave latches which store a background configuration plane and a foreground configuration plane.

10. The reconfigurable system of claim 9, further comprising an address decode circuit, wherein the master/slave latches are connected to write select lines from the address decode circuit.

11. A reconfigurable system comprising:
a reconfigurable programmable sum of products generator which is configured by a configuration memory such that the programmable sum of products generator is reconfigurable, the configuration memory adapted to concurrently store more than one configuration for the reconfigurable programmable sum of products generator, wherein the programmable sum of products generator includes two orthogonal NOR evaluation planes, the first plane having product term lines connected to a first precharge circuitry, the second plane having output lines connected to a second precharge circuitry, wherein the product term lines and output lines are both precharged during a first portion of the clocking cycle and wherein the product terms and output terms are evaluated during a second portion of the clock cycle.

12. The reconfigurable system of claim 11 further comprising invertors at the output of the second NOR evaluation plane and at least some inputs of the first NOR evaluation plane.

13. The reconfigurable system of claim 11, wherein memory elements of the configuration memory comprise master/slave latches.

14. A reconfigurable system comprising:
a reconfigurable programmable sum of products generator which is configured by a configuration memory such that the programmable sum of products generator is reconfigurable, wherein the programmable sum of products generator includes two orthogonal NOR evaluation planes, the each plane having precharge circuitry, each plane having an array of evaluation elements, the evaluation elements having an input transistor connecting between a first line and the gate of a second transistor, the gate of the first transistor being connected to a memory element of the configuration memory, the second transistor connected between a second line and ground, wherein, in the first NOR plane, the first lines are input lines and the second lines are product term lines and in the second NOR plane, the first lines are product term lines and the second lines are output lines.

15. A reconfigurable system of claim 14, wherein the memory element is adapted to store more than one configuration bit.

16. The reconfigurable system of claim 15, wherein the memory element stores one bit from a background plane and one bit from a foreground plane.

17. The reconfigurable system of claim 14, where an invertor is positioned at the output lines of the second NOR evaluation plane and an invertor positioned at some of the inputs of the first NOR evaluation plane.

* * * * *